United States Patent
Auvray et al.

(10) Patent No.: US 11,624,779 B2
(45) Date of Patent: Apr. 11, 2023

(54) INTEGRATED CIRCUIT AND METHOD FOR DIAGNOSING AN INTEGRATED CIRCUIT

(71) Applicants: STMicroelectronics (Alps) SAS, Grenoble (FR); STMicroelectronics (Grenoble 2) SAS, Grenoble (FR)

(72) Inventors: Etienne Auvray, Charavines (FR); Tommaso Melis, Grenoble (FR); Philippe Sirito-Olivier, St. Egreve (FR)

(73) Assignees: STMicroelectronics (Alps) SAS, Grenoble (FR); STMicroelectronics (Grenoble 2) SAS, Grenoble (FR)

( * ) Notice: Subject to any disclaimer, the term of this patent is extended or adjusted under 35 U.S.C. 154(b) by 29 days.

(21) Appl. No.: 17/375,450

(22) Filed: Jul. 14, 2021

(65) Prior Publication Data

US 2022/0018899 A1    Jan. 20, 2022

(30) Foreign Application Priority Data

Jul. 15, 2020    (FR) ...................................... 2007423

(51) Int. Cl.
*G01R 31/311* (2006.01)
*G01R 31/28* (2006.01)
(Continued)

(52) U.S. Cl.
CPC ............ *G01R 31/311* (2013.01); *G01R 15/22* (2013.01); *G01R 19/0084* (2013.01); *G01R 31/2851* (2013.01)

(58) Field of Classification Search
CPC .... G01R 31/00; G01R 31/28; G01R 31/2851; G01R 31/2855; G01R 31/2856;
(Continued)

(56) References Cited

U.S. PATENT DOCUMENTS

| 5,248,936 A | 9/1993 | Nakata et al. |
| 5,270,655 A | 12/1993 | Tomita |

(Continued)

FOREIGN PATENT DOCUMENTS

| CA | 2645200 A1 | * | 9/2007 | ............. G01N 30/74 |
| CN | 101576565 A | * | 11/2009 | ............. G01R 31/28 |

(Continued)

OTHER PUBLICATIONS

Agrawal, Vishwani D., et al., "A Tutorial on Built-In Self-Test", IEEE Des. Test Comput., vol. 10, No. 1, Mar. 1993, 10 pages.

(Continued)

*Primary Examiner* — Hoai-An D. Nguyen
(74) *Attorney, Agent, or Firm* — Slater Matsil, LLP

(57) ABSTRACT

According to one aspect, an integrated circuit includes: an electronic module configured to generate a voltage at an output, and an electronic control circuit coupled to an output of the electronic module, the electronic control circuit comprising an emissive electronic component. The electronic control circuit is configured to cause the emissive electronic component to emit light radiation as a function of a value of the voltage at the output of the electronic module relative to a value of an operating voltage of the electronic module, and the operating voltage is specific thereto during normal operation of this electronic module. The light radiation emitted by the emissive electronic component is configured to diffuse to an outer face of the integrated circuit.

21 Claims, 2 Drawing Sheets

(51) Int. Cl.
*G01R 19/00* (2006.01)
*G01R 15/22* (2006.01)

(58) Field of Classification Search
CPC ............ G01R 31/2872; G01R 31/2879; G01R 31/302; G01R 31/308; G01R 31/311; G01R 15/00; G01R 15/14; G01R 15/22; G01R 19/00; G01R 19/0084; G01R 19/0082
USPC .................................. 324/500, 537, 762.01
See application file for complete search history.

(56) References Cited

U.S. PATENT DOCUMENTS

| | | | | |
|---|---|---|---|---|
| 5,752,102 | A * | 5/1998 | Matsui | H05B 41/32 |
| | | | | 396/206 |
| 6,107,107 | A * | 8/2000 | Bruce | G01R 31/311 |
| | | | | 438/57 |
| 6,815,973 | B1 | 11/2004 | Conn | |
| 2005/0127933 | A1 | 6/2005 | Wills | |
| 2006/0232290 | A1 | 10/2006 | Kuo et al. | |
| 2009/0158092 | A1 | 6/2009 | Anand et al. | |
| 2020/0284883 | A1 * | 9/2020 | Ferreira | G01S 17/10 |

FOREIGN PATENT DOCUMENTS

| | | | | |
|---|---|---|---|---|
| DE | 102016104342 | B4 * | 4/2019 | F21S 8/086 |
| JP | H04199726 | A | 7/1992 | |
| JP | H09080120 | A | 3/1997 | |

OTHER PUBLICATIONS

Auvray, Etienne et al., "Use of Analog Simulation in Failure Analysis: Application to Emission Microscopy and Laser Voltage Probing Techniques", Proceedings from the 44th International Symposium for Testing and Failure Analysis (ISTFA), US, Oct. 28-Nov. 1, 2018, 8 pages.

Barragan, Manual J., "A Fully-Digital BIST Wrapper Based on Ternary Test Stimuli for the Dynamic Test of a 40 nm CMOS 18-bit Stereo Audio ΣΔ Adc", IEEE Trans. Circuits Syst., Regular Paper, vol. 63, No. 11, Nov. 2016, 13 pages.

Boit, Christian, "Fundamentals of Photon Emission (PEM) in Silicon—Electroluminescence for Analysis of Electronic Circuit and Device Functionality", Microelectronics Failure Analysis Desk Reference, Jan. 2004, 13 pages.

Malloug, Hani et al., "Mostly-digital design of sinusoidal signal generators for mixed-signal BIST applications using harmonic cancellation", IEEE 21st International Mixed-Signal Testing Workshop (IMSTW), Jul. 4-6, 2016, 6 pages.

Pavlidis, A, et al., "Symmetry-based A/MS BIST (SymBIST): Demonstration on a SAR ADC IP", IEEE Design, Automation & Test in Europe Conference & Exhibition, Mar. 9-13, 2020, HAL archives-ouvertes.fr, 5 pages.

Sunter, Stephen et al., "Using Mixed-Signal Defect Simulation to Close the Loop Between Design and Test", IEEE Transactions on Circuits and Systems I: Regular Papers, vol. 63, No. 12, Dec. 2016, 10 pages.

Synopsys, "PrimeSim Custom Fault—Redefining Analog Fault Simulation for Functional Safety and Test Coverage Analysis", Datasheet, https://www.synopsys.com/verification/ams-verification/testmax-customfault.html, Mar. 17, 2021, 3 pages.

Zivkovic, Vladimir et al., "Requirements, for Industrial Analog Fault Simulator", 16th International Conference on Synthesis, Modeling, Analysis and Simulation Methods and Applications to Circuit Design (SMACD), Switzerland, Jul. 15-18, 2019, 4 pages.

Huang, BeiJu et al., "Monolithic Integration of Light Emitting Diodes, Photodetector and Receiver Circuit in Standard CMOS Technology", Chinese Academy of Science, China, IEEE 9th International Conference on Solid-State and Integrated-Circuit Technology, Oct. 20-23, 2008, 3 pages.

* cited by examiner

INTEGRATED CIRCUIT AND METHOD FOR DIAGNOSING AN INTEGRATED CIRCUIT

This application claims the benefit of French Patent Application No. 2007423, filed on Jul. 15, 2020, which application is hereby incorporated herein by reference in its entirety.

TECHNICAL FIELD

The embodiments and methods of implementing the invention relate to integrated circuits and methods for performing diagnostics on such integrated circuits.

BACKGROUND

An integrated circuit generally comprises a plurality of electronic modules, each electronic module being configured to perform a given electronic function. These electronic modules can be subject to failures that can in particular result from the manufacture of the integrated circuit or from the wear thereof over time. In order to remedy these failures, each faulty electronic module of the integrated circuit may first be identified.

In this respect, one known method for identifying the faulty electronic modules of an integrated circuit is emission microscopy, which involves analyzing the light radiation emitted by the electronic modules of this integrated circuit.

More specifically, the electronic modules comprise electronic components that can emit light radiation, particularly during the operation thereof, when an electric current flows there through. The light radiation can be visible or infrared. In particular, this light radiation can have a wavelength comprised between 400 nm (visible) and 1,400 nm (near infrared). The electronic components that can emit such light radiation can be MOS transistors or diodes, for example.

This light radiation produced by the electronic components of the different electronic modules propagates as far as an outer face of the integrated circuit which can be observed from outside the integrated circuit. An image of the light radiation produced by the electronic components of the electronic modules can thus be acquired in order to analyze the integrated circuit.

To identify the faulty electronic modules, images of the light radiation produced by the faulty integrated circuit analyzed can be compared with images of the light radiation produced by a functional integrated circuit that is identical to the integrated circuit analyzed. The images of the faulty integrated circuit can differ from the images of the functional integrated circuit due to the fact that the faulty electronic modules of the faulty integrated circuit do not necessarily produce light radiation. The analysis of the differences between the images of the faulty integrated circuit and those of the functional integrated circuit can thus be used to identify the faulty electronic modules.

Nevertheless, this method has certain limitations. More specifically, a failure of one electronic module could mean that other electronic modules, although functional when taken individually, cannot function because the electronic module is placed upstream of these functional electronic modules. These functional electronic modules could thus not produce any light radiation. It is therefore difficult to identify the faulty electronic module solely from images of light radiation.

The faulty integrated circuit can thus be tested in order to analyze each potentially faulty electronic module to identify the faulty electronic module. Testing the integrated circuit can require drilling through the integrated circuit to reach certain potentially faulty electronic modules. Testing the integrated circuit to detect the faulty electronic module is thus complex and can be time-consuming.

Moreover, faulty electronic modules can also sometimes emit light radiation, even though the signals generated by these electronic modules are incorrect.

Another solution for identifying a faulty electronic module is to include a test system within the integrated circuit, such as a BIST (Built-in-self-test) system. Such a test system is configured to perform self-diagnostics on the integrated circuit. Such a test system has the drawback of being expensive in terms of the space occupied in the integrated circuit and requires the use of a dedicated output to transmit diagnostics information outside the integrated circuit.

One solution for the quick and inexpensive identification of the faulty electronic modules of an integrated circuit should thus be proposed.

SUMMARY

According to one aspect, the invention proposes an integrated circuit comprising: electronic modules, each electronic module being configured to generate, at the output, a voltage, referred to as the operating voltage, which is specific thereto during normal operation of this electronic module, at least one electronic control circuit comprising an emissive electronic component, each electronic control circuit being disposed at the output of an electronic module, the at least one electronic control circuit and the emissive electronic component thereof being configured so as to enable the emissive electronic component to emit light radiation as a function of the value of the voltage at the output of this electronic module relative to the value of the operating voltage, the integrated circuit being configured such that the light radiation that can be emitted by the emissive electronic component can diffuse to an outer face of the integrated circuit.

The light radiation that can be produced by the emissive electronic component can thus be observed from outside the integrated circuit on the outer face of the integrated circuit.

The at least one electronic control circuit thus makes it possible to report, by means of the light radiation that can be produced by the emissive electronic component, whether or not an electronic module placed upstream of this electronic control circuit in the integrated circuit is faulty. More specifically, the light radiation is produced as a function of the value of the voltage at the output of the electronic module to which the electronic control circuit is connected relative to an expected output voltage during normal operation of this electronic module (i.e. the operating voltage).

The use of the at least one electronic control circuit thus facilitates diagnostics performed on such an integrated circuit following a failure of an electronic module. More specifically, the identification of faulty electronic modules is facilitated by the at least one electronic control circuit.

In particular, in order to perform diagnostics on such an integrated circuit following a failure of an electronic module, the faulty electronic module can be identified by analyzing the light radiation that can be produced by the emissive electronic component.

The analysis of the light radiation that can be produced by the emissive electronic component can be carried out from an acquisition of at least one image of the light radiation produced by the integrated circuit from the outer face of the integrated circuit.

However, the location of the at least one electronic control circuit in the integrated circuit can be easily determined by studying the architecture thereof. Thus, an emission state of the emissive electronic component of the at least one electronic control circuit can be easily studied from the at least one acquired image of the light radiation produced by the integrated circuit at the locations of the at least one electronic control circuit.

The analysis of the emission state of the emissive electronic component of the at least one electronic control circuit makes it possible to determine whether or not an electronic module placed upstream of this electronic control circuit is faulty.

This analysis thus simplifies the identification of the faulty electronic modules by allowing a check to be carried out at at least one point of the integrated circuit to check the operation of the electronic modules placed upstream of this point.

Moreover, the use of the at least one electronic control circuit avoids the need for a comparison between images of the light radiation of the faulty integrated circuit and images of the light radiation of an identical but functional integrated circuit.

Furthermore, the at least one electronic control circuit has the advantage of occupying a small space within the integrated circuit.

Moreover, the at least one electronic control circuit also has the advantage of not affecting the operation of the integrated circuit.

In one advantageous embodiment, the at least one electronic control circuit and the emissive electronic component thereof are configured so as to enable the emissive electronic component to emit light radiation when the value of the voltage at the output of this electronic module reaches the value of the operating voltage. The emissive electronic component of an electronic control circuit thus emits light radiation only when the electronic module to which this electronic control circuit is connected is functioning correctly.

Alternatively, the at least one electronic control circuit and the emissive electronic component thereof are configured so as to enable the emissive electronic component to emit light radiation when the value of the voltage at the output of this electronic module is lower than the value of the operating voltage.

In the latter case, the emissive electronic component of an electronic control circuit thus emits light radiation only when the electronic module to which this electronic control circuit is connected is not functioning correctly.

This reduces the power consumption of the electronic control circuit. More specifically, the emissive electronic component of the at least one electronic control circuit does not consume power when each electronic module placed upstream of this electronic control circuit in the integrated circuit is functioning correctly.

In one advantageous embodiment, no metallic lines (or tracks) which could obstruct the light radiation of the emissive electronic component are disposed between the emissive electronic component and said outer face of the integrated circuit.

The light radiation that can be produced by the emissive electronic component of the at least one electronic control circuit can thus be easily observed from the outer face of the integrated circuit. The outer face of the integrated circuit can be a front face of the integrated circuit or a rear face of the integrated circuit.

In one advantageous embodiment, the light radiation is visible or infrared. In particular, this light radiation can have a wavelength comprised between 400 nm (visible) and 1,400 nm (near-infrared).

In one advantageous embodiment, the emissive electronic component is a diode, for example an N-Well diode.

In particular, the diode produces light radiation when it is on.

Preferably, the electronic circuit thus comprises a resistor disposed in series relative to the diode and connected to a ground. This resistor is configured to define the current flowing through the diode.

Alternatively, the emissive electronic component can be a transistor, in particular a MOS transistor.

In particular, the transistor produces light radiation when it is on. The transistor can thus be controlled by the voltage at the output of the electronic module to which the electronic control circuit including this transistor is connected.

In one advantageous embodiment, the integrated circuit comprises a circuit configured to switch off at least one electronic control circuit, which can reduce the power consumption of the integrated circuit.

According to another aspect, the invention proposes a method of performing diagnostics on an integrated circuit as described hereinabove, in which the integrated circuit is switched on and then at least one faulty electronic module is identified using the emissive electronic component of the at least one electronic control circuit. Such a diagnostics procedure is simple and inexpensive to implement.

Preferably, at least one image of the external face of the integrated circuit is acquired, the acquisition being adapted to capture the light radiation produced by the integrated circuit on the external face of the integrated circuit, the identification of at least one faulty electronic module being carried out on the basis of the at least one image acquired by analyzing an emission state of the emissive electronic component of the at least one electronic control circuit.

BRIEF DESCRIPTION OF THE DRAWINGS

Other advantages and features of the invention will become apparent upon examining the detailed description of non-limiting embodiments and methods of implementing the invention, and from the accompanying drawings in which.

DETAILED DESCRIPTION OF ILLUSTRATIVE EMBODIMENTS

Figure 1:
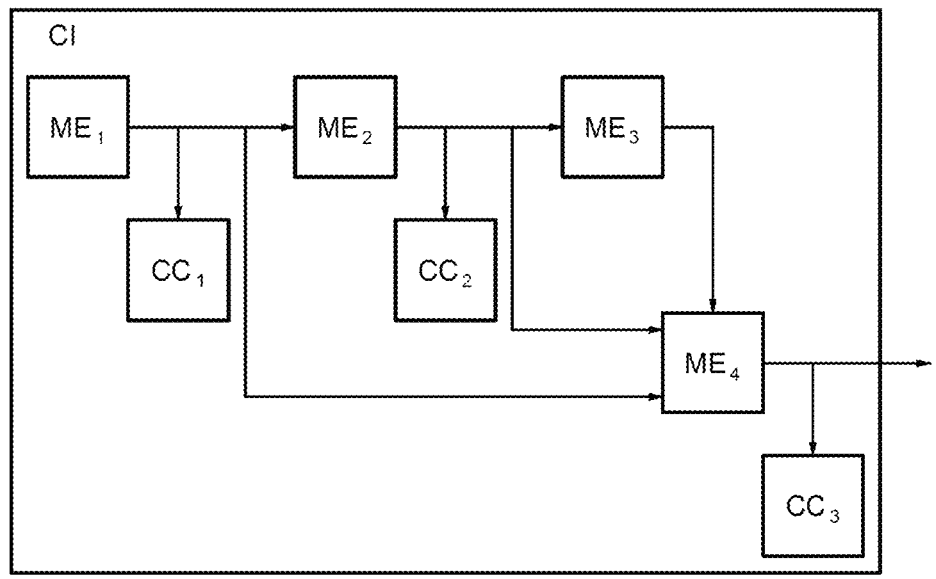
FIG. 1 shows an integrated circuit according to one embodiment.

FIG. 1 shows an integrated circuit CI according to one embodiment of the invention.

The integrated circuit CI takes the form of a die. The integrated circuit CI thus has a front face and a rear face, which is not shown. The integrated circuit CI comprises electronic modules ME1, ME2, ME3, ME4. Each electronic module ME1, ME2, ME3, ME4 is configured to perform a given electronic function of the integrated circuit.

Each electronic module can be either analogue or digital. For example, each electronic module ME1, ME2, ME3, ME4 can be selected from an amplifier, a potential controller, an oscillator and an analogue-to-digital converter. Each electronic module ME1, ME2, ME3, ME4 is configured to generate, at the output of this electronic module, a voltage, known as the operating voltage, which is specific thereto when this electronic module is operating correctly.

Nevertheless, electronic modules ME1, ME2, ME3, ME4 of the integrated circuit can fail. These failures can in particular result from the manufacture of the integrated circuit CI or from the wear thereof over time. Thus, if an electronic module ME1, ME2, ME3, ME4 is faulty, this electronic module could stop producing said operating voltage. The voltage at the output of this electronic module ME1, ME2, ME3, ME4 is thus zero.

The integrated circuit CI further comprises at least one electronic control circuit CC1, CC2, CC3. Each electronic control circuit CC1, CC2, CC3 is disposed at the output of a different electronic module ME1, ME2, ME4 of the integrated circuit. In particular, the electronic control circuit CC1 is connected to the output of the electronic module ME1, the electronic control circuit CC2 is connected to the output of the electronic module ME2, and the electronic control circuit CC3 is connected to the output of the electronic module ME4.

Each electronic control circuit CC1, CC2, CC3 allows the correct operation of the electronic module to which it is connected to be checked.

Figure 2:
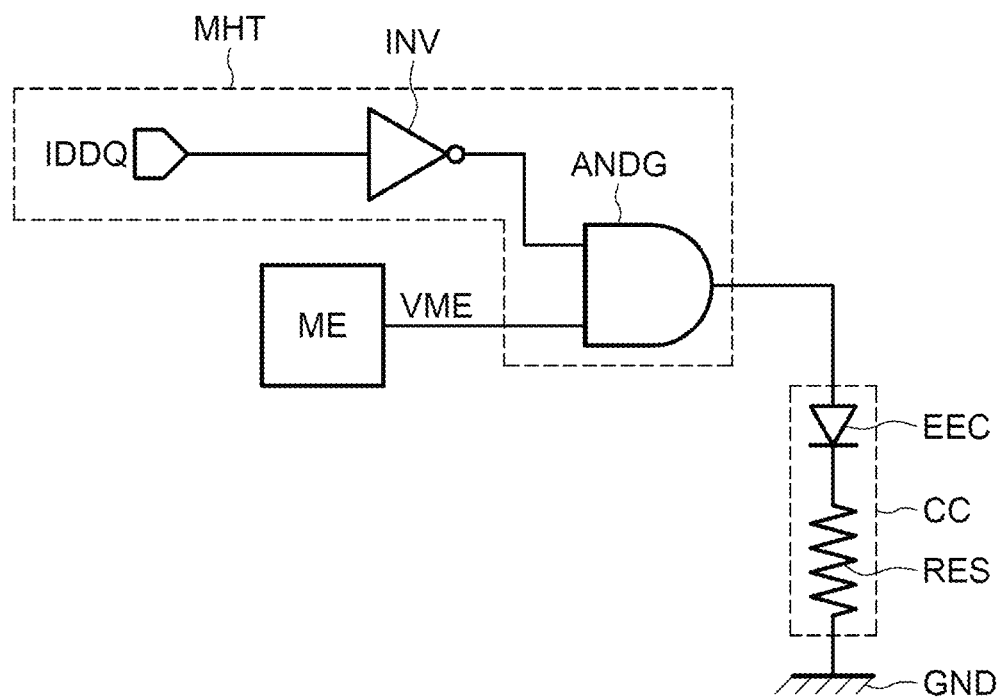
FIG. 2 illustrates a schematic of a circuit according to an embodiment.

Each electronic control circuit CC comprises an emissive electronic component EEC, as shown in FIG. 2. This emissive electronic component EEC is connected to the output of the electronic module ME to which the electronic control circuit CC comprising this emissive electronic component EEC is connected.

Each electronic control circuit CC and the emissive electronic component EEC thereof are configured such that the emissive electronic component EEC can produce light radiation as a function of the value of the voltage at the output of the electronic module ME to which this electronic component is connected relative to the value of the operating voltage of this electronic module ME.

The emissive electronic component EEC of each electronic control circuit CC can thus have two possible emission states. In a first emission state, this emissive electronic component EEC emits light radiation. In the other emission state, the emissive electronic component EEC does not emit any light radiation.

More particularly, in one embodiment, each electronic control circuit CC and the emissive electronic component EEC thereof are configured to allow the emissive electronic component EEC to emit light radiation when the voltage at the output of this electronic module ME reaches the operating voltage of this electronic module ME. The emissive electronic component EEC of the electronic control circuit CC thus emits light radiation only when the electronic module ME to which this electronic control circuit CC is connected is functioning correctly.

Alternatively, the at least one electronic control circuit CC and the emissive electronic component EEC thereof are configured so as to enable the emissive electronic component EEC to emit light radiation when the voltage at the output of this electronic module ME is lower than the operating voltage. In such a case, the emissive electronic component EEC of the electronic control circuit CC thus emits light radiation only when the electronic module ME to which this electronic control circuit CC is connected is not functioning correctly. This reduces the power consumption of the electronic control circuit. More specifically, the emissive electronic component of the at least one electronic control circuit does not consume power when each electronic module placed upstream of this electronic control circuit in the integrated circuit is functioning correctly.

The light radiation that can be emitted by the emissive electronic component EEC can be visible or infrared. In particular, this light radiation can have a wavelength comprised between 400 nm (visible) and 1,400 nm (near-infrared).

As shown in FIG. 2, the emissive electronic component EEC can be a diode, for example an N-Well diode. The electronic control circuit CC thus comprises a resistor RES disposed in series relative to the diode EEC and connected to a ground GND. This resistor is configured to define the current flowing through the diode EEC. In particular, the diode produces light radiation when it is on.

Moreover, the integrated circuit CI comprises metallic lines (or metallic tracks), not shown, used to connect different electronic components of the integrated circuit CI. Nonetheless, preferably no metallic line capable of obstructing the light radiation from the emissive electronic component EEC is disposed in the integrated circuit CI between the emissive electronic component EEC and an outer face of the integrated circuit, in particular the front face or the rear face of the integrated circuit.

The light radiation that can be produced by the emissive electronic component EEC can thus be easily observed from this outer face of the integrated circuit CI.

Moreover, preferably the integrated circuit CI comprises switch-off circuit MHT for switching off each electronic control circuit. The switch-off circuit MHT is configured to switch off the electronic circuit to which it is connected.

In particular, as shown in FIG. 2, the switch-off circuit MHT can comprise a logic gate ANDG to perform an AND logic function. This logic gate ANDG receives, at the input, the signal VME at the output of the electronic module ME to which the electronic control circuit CC is connected, as well as a switch-off signal IDDQ inverted by an inverter gate INV. The AND logic gate has an output connected to the electronic control circuit CC. Thus, when the switch-off signal is in a high state to switch off the electronic control circuit CC, the AND logic gate generates a low state signal regardless of the signal at the output of the electronic module ME. The voltage at the input of the electronic control circuit CC is thus zero.

Switch-off circuit MHT thus reduce the power consumption of the integrated circuit by switching off the electronic control circuit CC to which it is connected. Each electronic control circuit CC makes it possible to report, by means of the light radiation that can be produced by the emissive electronic component EEC thereof, whether or not an electronic module ME placed upstream of this electronic control circuit CC in the integrated circuit CI is faulty. More specifically, the light radiation is produced as a function of the value of the voltage at the output of the electronic module to which the electronic control circuit is connected relative to an expected output voltage value during normal operation of this electronic module (i.e. said operating voltage).

The use of the at least one electronic control circuit CC facilitates diagnostics performed on such an integrated circuit CI following a failure of an electronic module ME. More specifically, the identification of faulty electronic modules is facilitated by the at least one electronic control circuit. In particular, in order to perform diagnostics on such an integrated circuit CI following a failure of an electronic module ME, the faulty electronic module ME can be identified by analyzing the light radiation that can be produced by the emissive electronic component EEC of each electronic control circuit CC.

Figure 3:
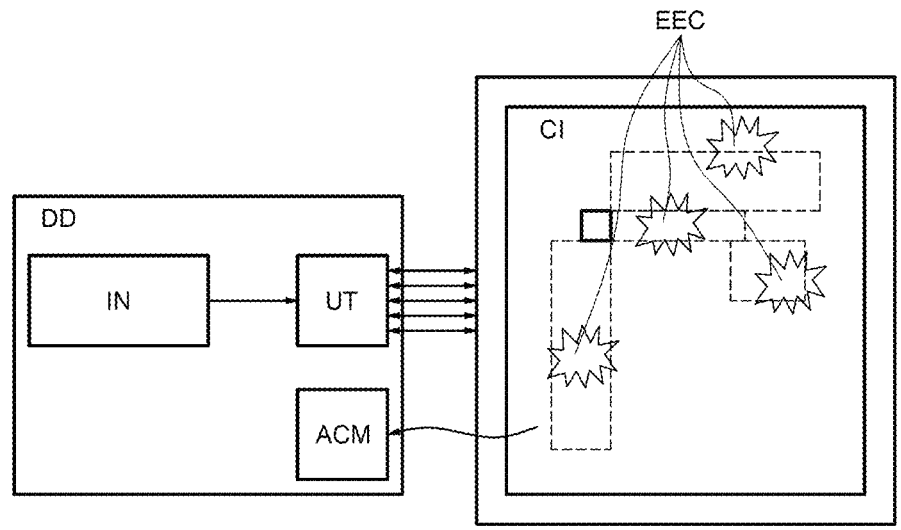
FIG. 3 illustrates a block diagram of a diagnostic device coupled to an integrated circuit according to an embodiment.

In particular, FIG. 3 shows a diagnostic device DD for performing diagnostics on an integrated circuit CI such as that described hereinabove comprising at least one faulty electronic module. The diagnostic device DD comprises an input configured to receive a simulation file in particular comprising a sequence of instructions to be carried out to test the device and the expected states of the signals of the integrated circuit in response to these instructions.

The diagnostic device DD comprises a test unit UT configured to be able to command the integrated circuit CI by way of the instructions in a simulation file received by the input IN and acquire the status of the signals from the integrated circuit in response to the instructions. The test unit UT is also configured to receive the states of the signals from the integrated circuit acquired by the test unit and the expected states of the signals indicated by the simulation file. The analysis unit UT is further configured to compare the acquired states of the signals with the expected states of the signals indicated by the simulation file. The analysis unit is further configured to report any acquired states of the signals that differ from those expected based on the comparison results.

Moreover, the diagnostic device DD comprises image acquisition device ACM configured to capture the light radiation produced by the integrated circuit CI visible from an external face of the integrated circuit CI. The image acquisition device ACM can be a camera configured to capture light radiation having a wavelength comprised between 400 nm (visible) and 1,400 nm (near infrared).

Preferably, the image acquisition device ACM is disposed in such a way that an image of the light radiation visible from the rear face of the integrated circuit CI can be acquired.

Figure 4:
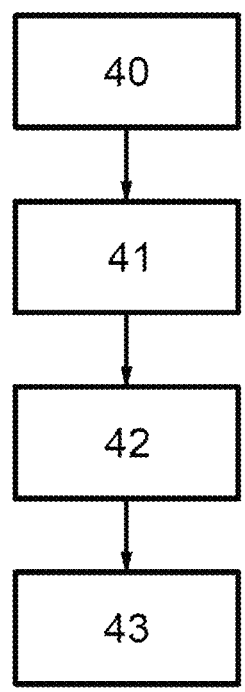
FIG. 4 illustrates a block diagram of an embodiment method.

FIG. 4 shows a diagnostic method that can be implemented using the aforementioned diagnostic device. In order to carry out this diagnostic method, information is retrieved on the locations of the emissive electronic components in the integrated circuit so as to facilitate the identification of these emissive electronic components.

Moreover, information is retrieved on an expected emission state of the emissive electronic component of each electronic control circuit of the integrated circuit CI when the electronic module placed upstream of this electronic control circuit is functional or faulty.

A simulation file such as that described hereinabove, which is received at the input IN of the diagnostic device DD, is also used.

The method firstly comprises a step 40 of switching on the integrated circuit CI. This switch-on step 40 enables a start-up phase of the integrated circuit CI to be initiated. This switching on can be controlled by the test unit UT according to the simulation file. During this start-up phase, the faulty electronic modules do not output a correct voltage, i.e. the operating voltage thereof. Then, in a step 41, the test unit UT controls the integrated circuit CI according to the instructions in the simulation file.

The method further comprises an acquisition step 42 wherein the image acquisition device ACM acquires an image of the light radiation of the faulty integrated circuit CI while the test unit controls the integrated circuit according to the instructions in the simulation file.

Preferably, a plurality of images of the light radiation is acquired at different times when the test unit UT controls the integrated circuit in order to obtain a sequence of emission states of the emissive components.

The method then comprises an analysis step 42 wherein the acquired images are analyzed in order to identify the emission state of the emissive electronic component of each electronic control circuit.

The analysis of the emission state of the emissive electronic component of each electronic control circuit makes it possible to determine whether the electronic module placed upstream of this electronic control circuit is functional or whether one of the electronic modules placed upstream of this emissive electronic component is faulty. Thus, once the emission states of the emissive electronic components have been identified, the method comprises a step 43 of identifying the faulty electronic modules. In particular, the identified emission states of the emissive electronic components are compared with the expected emission states of the emissive electronic components. This comparison makes it possible to determine whether the identified emission states of the emissive electronic components are different from the expected emission states of the emissive electronic components.

The electronic modules are then identified based on the results of these comparisons. In particular, if the identified emission state of an emissive electronic component is different from the expected emission state for this emissive electronic component, then an electronic module placed upstream of this emissive electronic component is faulty.

Steps 42 and 43 for analyzing and identifying the faulty modules can be carried out by a person or automatically by a processing unit.

Furthermore, in order to simplify the identification of the faulty modules, the test unit of the diagnostic device can be used to identify the electronic module from which signals could be faulty. This reduces the number of electronic modules to be analyzed on the basis of said at least one image acquired in order to identify the one or more faulty electronic modules.

Such a diagnostic method thus simplifies the identification of the faulty electronic modules by allowing a check to be carried out at at least one point of the integrated circuit to check the operation of the electronic modules placed upstream of this point.

Moreover, the use of said at least one electronic control circuit avoids the need for a comparison between images of the light radiation of the faulty integrated circuit and images of the light radiation of an identical but functional integrated circuit, as is the case in known diagnostic methods. More specifically, knowledge of the emission states of the functional emissive components of an integrated circuit according to the instructions in the simulation file is sufficient to identify the faulty modules of a faulty integrated circuit.

Furthermore, the at least one electronic control circuit has the advantage of occupying a small space within the integrated circuit.

Moreover, the at least one electronic control circuit also has the advantage of not affecting the operation of the integrated circuit.

It goes without saying that various alternatives and amendments that may be apparent to a person skilled in the art can be made to the present invention. For example, as an alternative to a diode, the emissive electronic component can be a transistor, for example a MOS transistor. The transistor thus produces light radiation when it is on. The transistor can thus be controlled by the voltage at the output of the electronic module to which the electronic control circuit including this transistor is connected.

What is claimed is:

1. An integrated circuit comprising:
an electronic module configured to generate a voltage at an output; and
an electronic control circuit coupled to the output of the electronic module, the electronic control circuit comprising an emissive electronic component, the electronic control circuit configured to cause the emissive electronic component to emit light radiation as a function of a value of the voltage at the output of the electronic module relative to a value of an operating voltage of the electronic module, the operating voltage being specific thereto during normal operation of this electronic module, wherein the light radiation emitted by the emissive electronic component is configured to diffuse to an outer face of the integrated circuit.

2. The integrated circuit of claim 1, wherein the electronic module comprises a plurality of electronic modules, and the electronic control circuit comprises a plurality of electronic control circuits.

3. The integrated circuit of claim 2, wherein each electronic module of the plurality of electronic modules is coupled to a corresponding electronic control circuit of the plurality of electronic control circuits.

4. The integrated circuit according to claim 1, wherein the electronic control circuit is configured to enable the emissive electronic component to emit the light radiation when the value of the voltage at the output of this electronic module reaches the value of the operating voltage.

5. The integrated circuit according to claim 1, wherein the electronic control circuit is configured to enable the emissive electronic component to emit the light radiation when the value of the voltage at the output of the electronic module is less than the value of the operating voltage.

6. The integrated circuit according to claim 1, wherein the integrated circuit is free of metallic lines disposed between the emissive electronic component and the outer face of the integrated circuit that could obstruct the light radiation generated by the emissive electronic component.

7. The integrated circuit according to claim 1, wherein the light radiation has a wavelength between 400 nm and 1,400 nm.

8. The integrated circuit according to claim 1, wherein the emissive electronic component is a diode.

9. The integrated circuit according to claim 8, wherein the diode is an N-Well diode.

10. The integrated circuit according to claim 1, wherein the emissive electronic component is a transistor.

11. The integrated circuit according to claim 1, comprising a circuit configured to switch-off the electronic control circuit.

12. A method for performing diagnostics on an integrated circuit comprising an electronic module configured to generate a voltage at an output, and an electronic control circuit coupled to the output of the electronic module, wherein the electronic control circuit comprises an emissive electronic component, the electronic control circuit is configured to cause the emissive electronic component to emit light radiation as a function of a value of the voltage at the output of the electronic module relative to a value of an operating voltage of the electronic module, the operating voltage is specific thereto during normal operation of this electronic module, and the light radiation emitted by the emissive electronic component is configured to diffuse to an outer face of the integrated circuit, the method comprising:
turning on the integrated circuit; and
monitoring the emissive electronic component for emitted light radiation; and
determining whether the electronic module is faulty based on the monitoring.

13. The method according to claim 12, wherein:
monitoring the emissive electronic component comprises acquiring at least one image of the outer face of the integrated circuit; and
determining whether the electronic module is faulty comprises analyzing an emission state of the emissive electronic component based on the at least one image.

14. The method according to claim 13, wherein acquiring the at least one image comprises using a camera.

15. The method according to claim 12, wherein:
the electronic module comprises a plurality of electronic modules, the electronic control circuit comprises a plurality of electronic control circuits;
monitoring the emissive electronic component comprises acquiring plurality of sequential images of the outer face of the integrated circuit; and
determining whether the electronic module is faulty comprises analyzing a plurality of emission states of the emissive electronic components of the plurality of electronic modules based on the plurality of sequential images.

16. The method according to claim 15, further comprising causing the plurality of electronic modules to perform a test sequence during the monitoring.

17. The method according to claim 15, further comprising determining whether a particular electronic module of the plurality of electronic modules is faulty based on the analyzing the plurality of emission states.

18. A method of operating an integrated circuit comprising a plurality of testable electronic circuits, each testable electronic circuit comprising an electronic module coupled to an electronic control circuit comprising an emissive electronic component, the method comprising, for each for each control circuit of the plurality of testable electronic circuits:
monitoring an output signal of the electronic module,
comparing the monitored output signal with a reference level,
causing the emissive electronic component to emit light radiation based on the comparing, wherein the emitted light radiation is configured to diffuse to an outer face of the integrated circuit.

19. The method according to claim 18, wherein the output signal is an output voltage, and the reference level corresponds to an operating voltage of the electronic module during normal operation.

20. The method according to claim 18, wherein causing the emissive electronic component to emit the light radiation based on the comparing comprises causing the emissive electronic component to emit the light radiation when the monitored output signal reaches the reference level.

21. The method according to claim 18, wherein causing the emissive electronic component to emit the light radiation based on the comparing comprises causing the emissive electronic component to emit the light radiation when the monitored output signal is less than the reference level.

* * * * *